US012225826B2

(12) United States Patent
Satoh et al.

(10) Patent No.: US 12,225,826 B2
(45) Date of Patent: Feb. 11, 2025

(54) VIBRATION DEVICE

(71) Applicant: TDK CORPORATION, Tokyo (JP)

(72) Inventors: Akira Satoh, Tokyo (JP); Kaoru Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 297 days.

(21) Appl. No.: 18/079,292

(22) Filed: Dec. 12, 2022

(65) Prior Publication Data

US 2023/0232722 A1    Jul. 20, 2023

(30) Foreign Application Priority Data

Jan. 17, 2022 (JP) ................................ 2022-004949

(51) Int. Cl.
*H10N 30/87* (2023.01)
*H04R 17/00* (2006.01)
*H10N 30/88* (2023.01)

(52) U.S. Cl.
CPC ........... *H10N 30/875* (2023.02); *H04R 17/00* (2013.01); *H10N 30/88* (2023.02)

(58) Field of Classification Search
CPC .......... H04R 1/1075; H04R 1/02; H04R 7/20; H04R 1/24; H04R 17/10; H04R 17/00; H04R 2440/07; H04R 2499/11; H04R 2217/01; H04R 2205/022; H04R 5/02; H04R 1/323; H04R 1/2888; H04R 7/04; H10N 30/88; H10N 30/875; H10N 30/871; H10N 30/872; H10N 30/2047; H10N 30/50; H10N 30/853; G06F 1/1605; G06F 1/00; H03H 9/17
See application file for complete search history.

(56) References Cited

U.S. PATENT DOCUMENTS

| | | | | |
|---|---|---|---|---|
| 2007/0071259 A1* | 3/2007 | Tojo | ....................... | H04R 1/323 |
| | | | | 381/388 |
| 2008/0130921 A1* | 6/2008 | Tokuhisa | ................. | H04R 1/08 |
| | | | | 381/190 |
| 2011/0285249 A1* | 11/2011 | Ishii | ...................... | B06B 1/0603 |
| | | | | 310/334 |

(Continued)

FOREIGN PATENT DOCUMENTS

JP     2017017426 A   *  1/2017

*Primary Examiner* — Carolyn R Edwards
*Assistant Examiner* — Julie X Dang
(74) *Attorney, Agent, or Firm* — Oliff PLC

(57) ABSTRACT

A vibration device includes: a piezoelectric unit including a piezoelectric element; a housing that holds the piezoelectric unit; a wiring member electrically connected to the piezoelectric unit; and a joining member that joins the housing to an external device. The housing includes a bottom surface portion to which the piezoelectric unit is fixed, and a side surface portion standing at an edge portion of the bottom surface portion. The side surface portion has a first surface formed on a top portion of the side surface portion, and a second surface that is one step lowered from the first surface by a cutout portion formed in the top portion. The joining member extends along the first surface to bridge over the cutout portion. The wiring member is joined to the joining member at a position of the first surface, and passes through the cutout portion in a state where the wiring member is not joined to the second surface.

5 Claims, 6 Drawing Sheets

(56) References Cited

U.S. PATENT DOCUMENTS

| | | | | |
|---|---|---|---|---|
| 2012/0075962 A1* | 3/2012 | Arimatsu | ............... | G04R 20/10 |
| | | | | 331/158 |
| 2012/0194285 A1* | 8/2012 | Yamazaki | ............... | H03H 9/215 |
| | | | | 310/366 |
| 2012/0313487 A1* | 12/2012 | Kim | ...................... | B06B 1/0662 |
| | | | | 310/346 |
| 2013/0026884 A1* | 1/2013 | Kim | ...................... | H10N 30/88 |
| | | | | 310/315 |
| 2015/0155470 A1* | 6/2015 | Mori | ...................... | H10N 30/06 |
| | | | | 310/326 |
| 2015/0255700 A1* | 9/2015 | Tamura | ............... | H03H 9/1021 |
| | | | | 310/348 |
| 2018/0062065 A1* | 3/2018 | Arakawa | ............... | H10N 30/88 |
| 2018/0062616 A1* | 3/2018 | Kijima | ................. | H10N 30/874 |

\* cited by examiner

VIBRATION DEVICE

TECHNICAL FIELD

The present disclosure relates to a vibration device.

BACKGROUND

As a vibration device of the related art, for example, there is an acoustic generator described in Japanese Unexamined Patent Publication No. 2017-017426. The acoustic generator of the related art includes a piezoelectric element including a surface electrode; a vibrating body attached to the piezoelectric element; a frame that supports the vibrating body; and a wiring member of which one end portion is connected to the surface electrode and of which the other end portion is fixed to the frame. A width of the other end portion of the wiring member is wider than widths of other portions.

The vibration device described above is characterized by obtaining a desired acoustic characteristic in vibration of a housing. In order to obtain the desired acoustic characteristic, it is important to stabilize a space characteristic inside the housing when the vibration device is attached to an external device. Since the wiring member electrically connected to the piezoelectric element exists inside the housing, it is considered that it is necessary to devise means for preventing the wiring member from affecting space design accuracy when the vibration device is attached to the external device.

SUMMARY

The present disclosure is conceived to solve the foregoing problem, and an object of the present disclosure is to provide a vibration device in which an acoustic characteristic is improved.

A vibration device according to one aspect of the present disclosure includes: a piezoelectric unit including a piezoelectric element; a housing that holds the piezoelectric unit; a wiring member electrically connected to the piezoelectric unit; and a joining member that joins the housing to an external device. The housing includes a bottom surface portion to which the piezoelectric unit is fixed, and a side surface portion standing at an edge portion of the bottom surface portion. The side surface portion has a first surface formed on a top portion of the side surface portion, and a second surface that is one step lowered from the first surface by a cutout portion formed in the top portion. The joining member extends along the first surface to bridge over the cutout portion. The wiring member is joined to the joining member at a position of the first surface, and passes through the cutout portion in a state where the wiring member is not joined to the second surface.

In the vibration device, the joining member that joins the housing to the external device is disposed on the first surface of the top portion of the side surface portion. For this reason, a state of attachment of the vibration device to the external device can be stabilized. In addition, in the vibration device, the wiring member passes through the cutout portion provided in the top portion of the side surface portion, and is joined to the joining member that bridges over the cutout portion, at the position of the first surface, but is not joined to the second surface that is one step lowered from the first surface. Since the wiring member is joined to the joining member on the first surface, the wiring member can be prevented from wobbling around the piezoelectric unit, and an influence on space design accuracy can be avoided. In addition, since the wiring member is not joined to the second surface, even when a dimensional error occurs in the cutout portion or the like, flatness of the joining member on the first surface is maintained, and stability of the state of attachment of the vibration device is maintained. Therefore, in the vibration device, a space characteristic around the piezoelectric unit can be easily ensured, and an acoustic characteristic is improved.

The joining member may be joined to at least a part of the second surface. In this case, since the wiring member is joined to both the first surface and the second surface, the wiring member can be more reliably prevented from wobbling around the piezoelectric unit.

A joining area between the wiring member and the joining member may be larger than a joining area between the second surface and the joining member. In this case, excessive joining between the second surface and the joining member can be avoided, and flatness of the joining member on the first surface can be maintained.

A tensile force may be applied to the wiring member in an extending direction of the wiring member between the piezoelectric unit and the cutout portion. Accordingly, even when vibration is applied to the housing, the generation of collision sound by interference of the wiring member with the housing can be suppressed. Therefore, an influence of the vibration on the space characteristic can be avoided.

The side surface portion may be smoothly continuous with the bottom surface portion, and may be inclined to open outward from the edge portion with respect to the bottom surface portion. In this case, vibration can be efficiently transmitted to the side surface portion from the bottom surface portion on which the piezoelectric unit is disposed, and vibration of the bottom surface portion and vibration of the side surface portion can be sufficiently extracted as an output. Therefore, the acoustic characteristic is further improved.

DETAILED DESCRIPTION

Hereinafter, an exemplary embodiment of a vibration device according to one aspect of the present disclosure will be described in detail with reference to the drawings.

Figure 1:
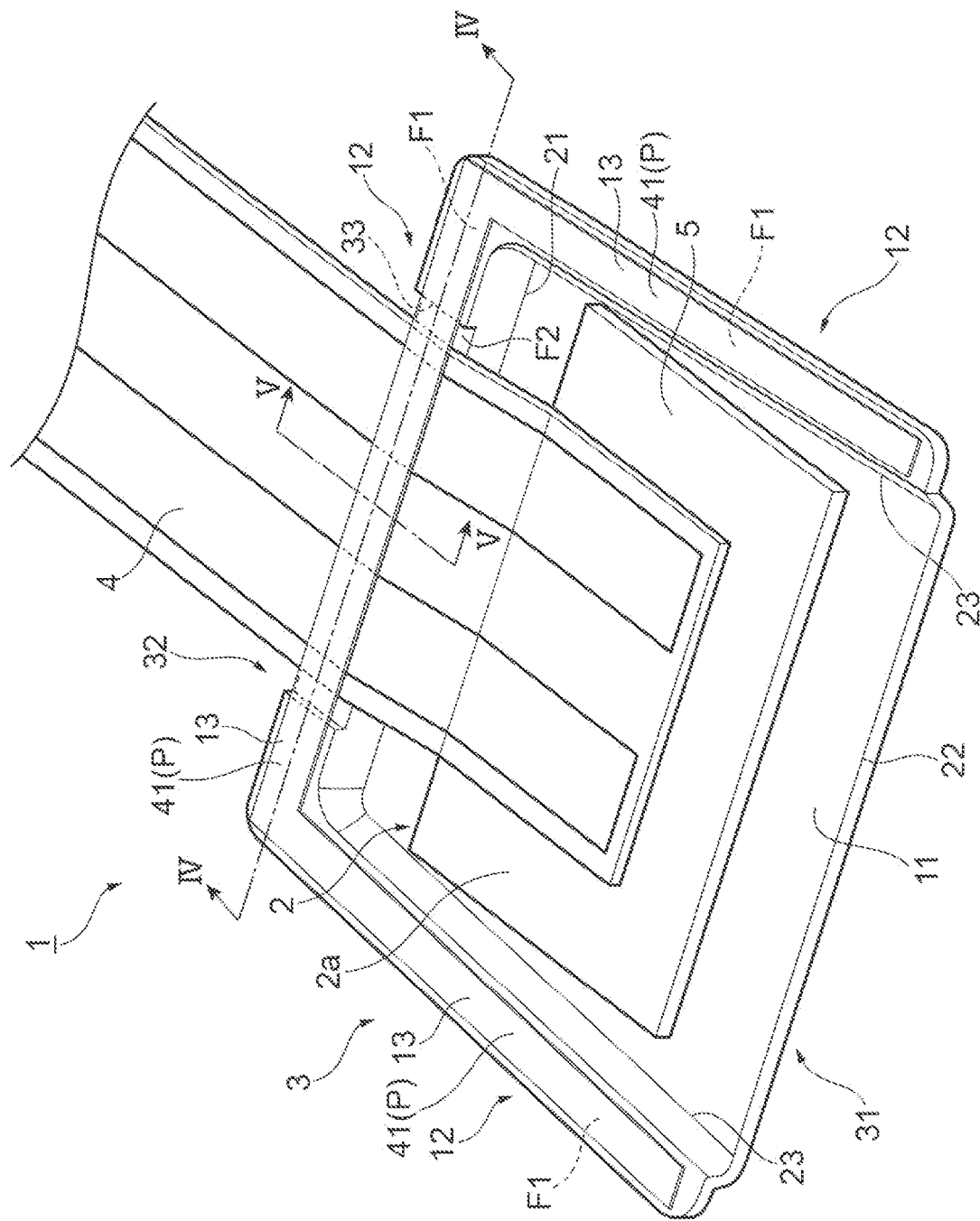
FIG. 1 is a perspective view illustrating one embodiment of a vibration device according to the present disclosure.

FIG. 1 is a perspective view illustrating one embodiment of a vibration device according to the present disclosure. A vibration device 1 is, for example, an acoustic device used as a speaker, a buzzer, or the like. As illustrated in FIG. 1, the vibration device 1 includes a piezoelectric unit 2, a housing 3, and a wiring member 4.

The piezoelectric unit 2 includes a piezoelectric element 5. The piezoelectric element 5 includes a piezoelectric element body and a pair of external electrodes. The piezoelectric element 5 has a rectangular parallelepiped shape that is flat in a thickness direction. The rectangular parallelepiped shape can also include a shape of which angular portions and ridge portions are chamfered, and a shape of which angular portions and ridge portions are rounded. The piezoelectric element body is formed of a laminate of a plurality of piezoelectric layers. Each of the piezoelectric layers is made of a piezoelectric material such as piezoelectric ceramic. Examples of the piezoelectric ceramic material include PZT[Pb(Zr,Ti)O₃], PT(PbTiO₃), PLZT[(Pb,La)(Zr,Ti)O₃], barium titanate (BaTiO₃), and the like.

Each of the piezoelectric layers is formed of, for example, a sintered body of ceramic green sheets containing the above-described piezoelectric ceramic. In the actual piezoelectric element body, the piezoelectric layers are integrated to an extent that boundaries between the piezoelectric layers cannot be recognized. A plurality of internal electrodes (not illustrated) are disposed inside the piezoelectric element body. Each of the internal electrodes is made of a conductive material. Examples of the conductive material include Ag, Pd, an Ag—Pd alloy, and the like.

The piezoelectric unit 2 may be configured such that a vibration plate is combined with the piezoelectric element 5. The vibration plate is a plate-shaped member made of, for example, a metal material. Examples of the metal material forming the vibration plate include a Ni—Fe alloy, Ni, brass, stainless steel, and the like. The vibration plate has, for example, a rectangular shape. The vibration plate is disposed on a bottom surface (surface on a housing 3 side) side of the piezoelectric element 5, and can be fixed to the piezoelectric element 5 and to the housing 3 using, for example, an adhesive material, double-sided tape, or the like.

The housing 3 is a member that holds the piezoelectric unit 2. The housing 3 is shaped, for example, by pressing working of metal. Examples of the metal material forming the housing 3 include stainless steel, aluminum, a 42Ni alloy, and the like. The housing 3 includes a bottom surface portion 11 and a plurality of side surface portions 12. The bottom surface portion 11 is a portion to which the piezoelectric unit 2 described above is fixed. Here, the side surface portions 12 stand at an edge portion of the bottom surface portion 11 to surround the piezoelectric unit 2.

A flange portion 13 that is directed outward is provided on a top portion 12a of each of the side surface portions 12. The flange portion 13 extends from the top portion 12a of the side surface portion 12 by a predetermined width so as to be parallel to the bottom surface portion 11. The flange portion 13 functions as an attachment portion for attaching the vibration device 1 to an external device. Double-sided tape 41 to be described later is affixed to one surface (surface opposite the bottom surface portion 11) of the flange portion 13.

The wiring member 4 is a member that electrically connects the piezoelectric unit 2 and the external device. The wiring member 4 is, for example, a flexible printed circuit (FPC) board. One end of the wiring member 4 is electrically connected to each of the pair of external electrodes of the piezoelectric element 5 on a one surface 2a side of the piezoelectric unit 2. For example, an anisotropic conductive adhesive material can be used to connect the one end of the wiring member 4 and the external electrodes of the piezoelectric element 5. The other end (not illustrated) of the wiring member 4 is electrically connected to the external device.

Next, a configuration of the housing 3 described above and a disposition relationship between the piezoelectric unit 2 and the housing 3 will be described with reference to FIGS. 2 and 3.

Figure 2:
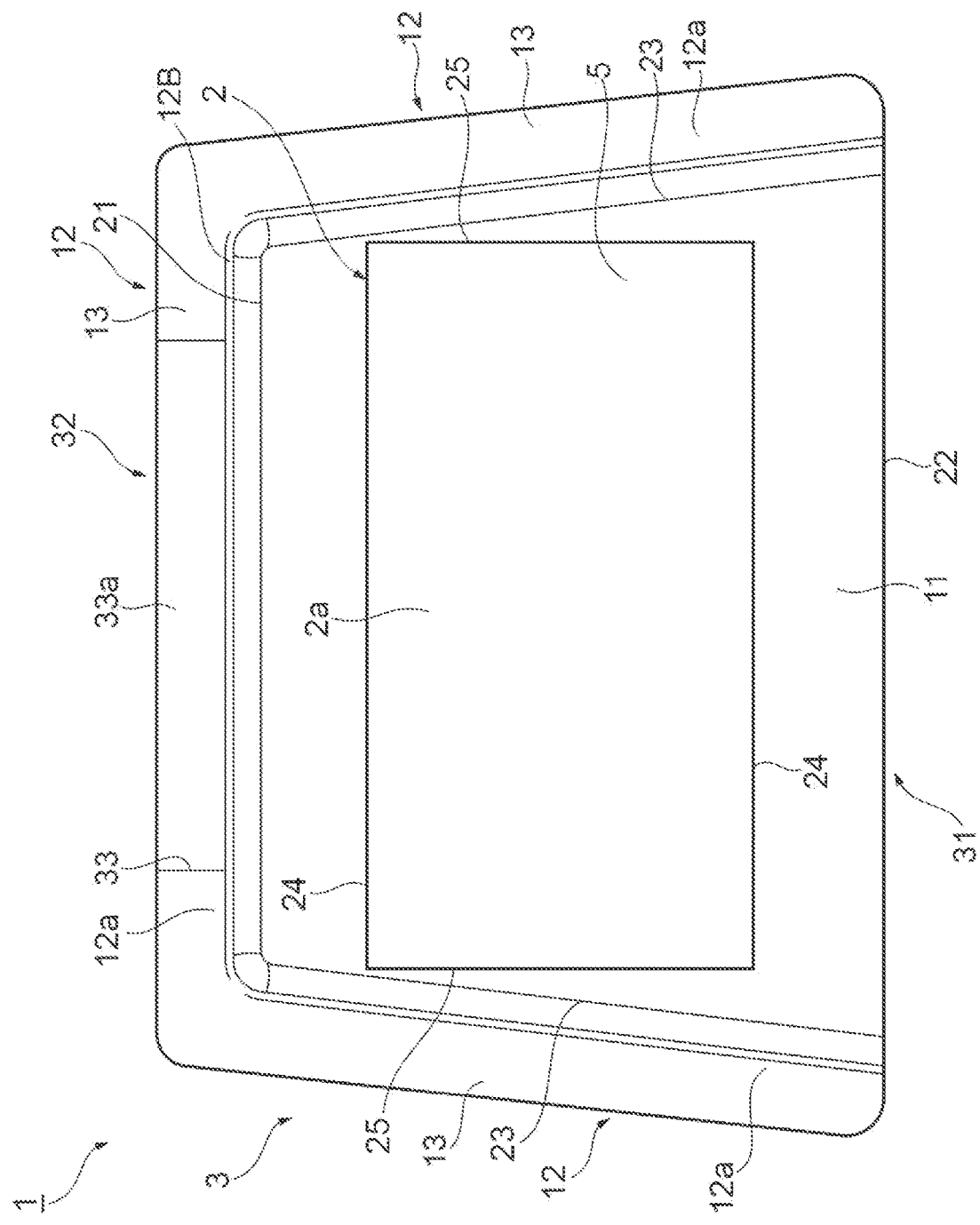
FIG. 2 is a plan view of the vibration device illustrated in FIG. 1.
Figure 3:
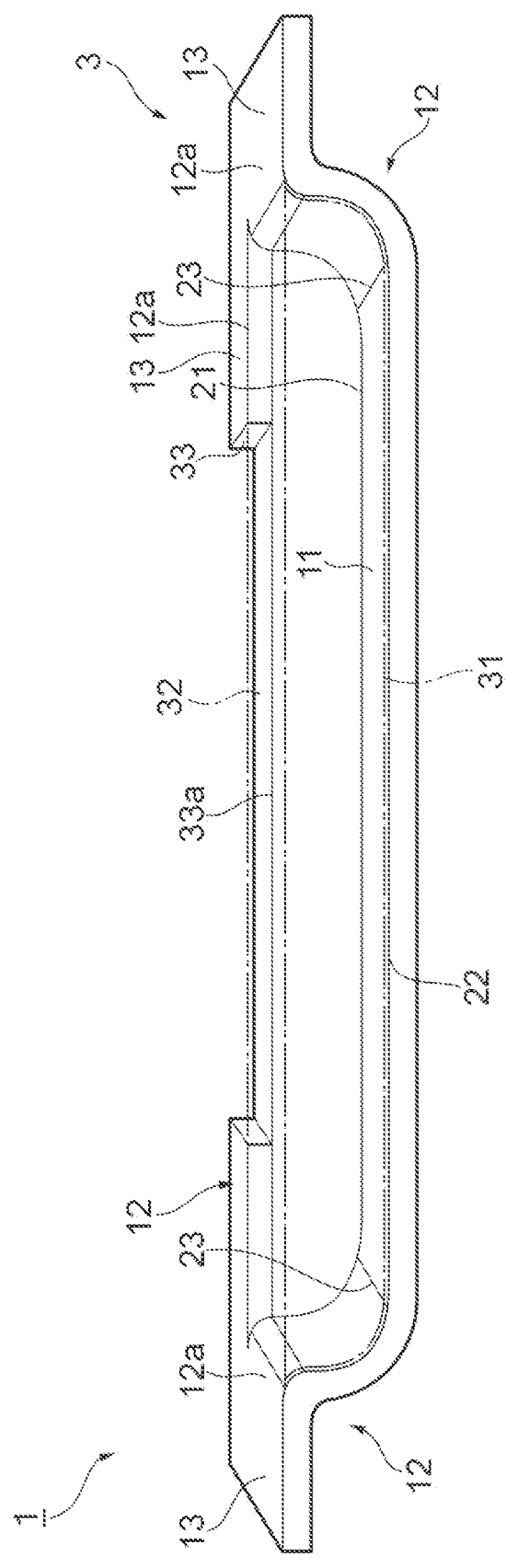
FIG. 3 is a front view of the vibration device illustrated in FIG. 1.

FIG. 2 is a plan view of the vibration device illustrated in FIG. 1, and FIG. 3 is a front view of the vibration device. In FIGS. 2 and 3, for convenience of description, the illustration of the wiring member 4 and the double-sided tape 41 to be described later are omitted. In FIG. 3, the illustration of the piezoelectric unit 2 is further omitted. As illustrated in FIGS. 2 and 3, in the present embodiment, the piezoelectric unit 2 has a rectangular shape in a plan view. A plan shape of the piezoelectric unit 2 is a plan shape of the piezoelectric element 5 when the piezoelectric unit 2 is formed of only the piezoelectric element 5, and is a plan shape of the vibration plate when the piezoelectric unit is formed of the piezoelectric element 5 and the vibration plate.

The bottom surface portion 11 of the housing 3 has a trapezoidal shape in a plan view. Namely, the bottom surface portion 11 has an upper base 21, a lower base 22, and a pair of oblique sides 23 and 23. Here, as illustrated in FIG. 2, a plan shape of the bottom surface portion 11 is an isosceles trapezoidal shape. The lower base 22 of the bottom surface portion 11 is larger than the upper base 21. Namely, the bottom surface portion 11 widens from the upper base 21 toward the lower base 22. The piezoelectric unit 2 is disposed on a substantially center portion of the bottom surface portion 11. The bottom surface portion 11 is a main vibration portion of the housing 3, and vibration caused by the piezoelectric unit 2 is directly transmitted to the bottom surface portion 11.

The upper base 21 and the lower base 22 of the bottom surface portion 11 extend along long sides 24 of the piezoelectric unit 2 in a plan view. The upper base 21 of the bottom surface portion 11 is shorter than the long sides 24 of the piezoelectric unit 2, and the lower base 22 of the bottom surface portion 11 is longer than the long sides 24 of the piezoelectric unit 2. A constant distance is provided between the lower base 22 of the bottom surface portion 11 and the long side 24 of the piezoelectric unit 2. The distance is shorter than, for example, short sides 25 of the piezoelectric unit 2.

The side surface portions 12 are provided to correspond to the upper base 21 and the pair of oblique sides 23 and 23 of the bottom surface portion 11. A height of the side surface portions 12 is larger than a thickness of the piezoelectric unit 2. Accordingly, the piezoelectric unit 2 disposed on the bottom surface portion 11 is surrounded by the side surface portions 12 in three directions, except for a lower base 22 side. The side surface portions 12 are smoothly continuous with the bottom surface portion 11, and are inclined to open outward from the edge portion with respect to the bottom surface portion 11. The side surface portions 12 are sub-vibration portions of the housing 3, and vibration caused by the piezoelectric unit 2 is transmitted to the side surface portions 12 via the bottom surface portion 11.

A first opening portion 31 is formed on a lower base 22 side of the bottom surface portion 11 by not providing the side surface portion 12. As illustrated in FIG. 3, the first opening portion 31 is defined by the bottom surface portion 11, by the side surface portions 12 and 12 corresponding to the oblique sides 23 and 23 of the bottom surface portion 11, and by an imaginary line connecting one surfaces (attachment surfaces to the external device) of the flange portions 13 and 13 of the side surface portions 12 and 12. The first opening portion 31 functions as an extraction port for extracting vibration caused by the piezoelectric unit 2 to the outside in a state where the vibration device 1 is attached to the external device.

A second opening portion 32 is formed on an upper base 21 side of the bottom surface portion 11 by cutting out a part of the top portion 12a of the side surface portion 12. As illustrated in FIG. 3, the second opening portion 32 is defined by a cutout portion 33 formed in the side surface portion 12 corresponding to the upper base 21 of the bottom surface portion 11, and by an imaginary line connecting the top portions 12a and 12a of the side surface portions 12 that interpose the cutout portion 33 therebetween. A width of the cutout portion 33 is slightly larger than a width of the wiring member 4. A depth of the cutout portion 33 from the top portion 12a of the side surface portion 12 is the same as a thickness of the wiring member 4 or is slightly larger than the thickness thereof. The second opening portion 32 functions as a lead-out port of the wiring member 4 electrically connected to the piezoelectric unit 2, in a state where the vibration device 1 is attached to the external device.

Subsequently, a holding structure of the wiring member 4 described above will be described with reference to FIGS. 1, 4, and 5.

Figure 4:
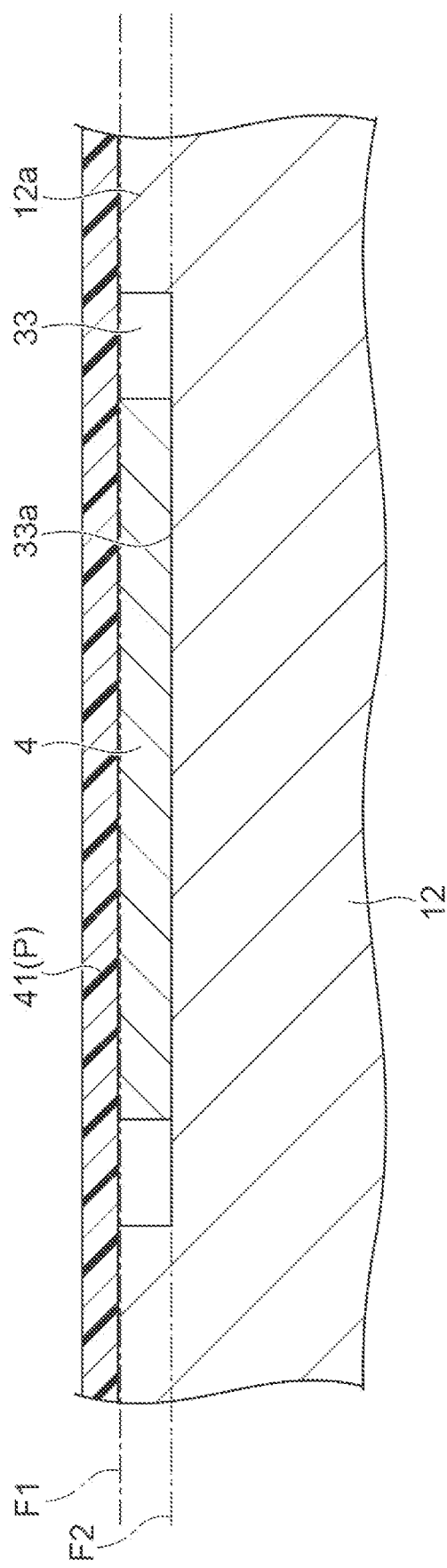
FIG. 4 is a cross-sectional view taken along line IV-IV in FIG. 1.
Figure 5:
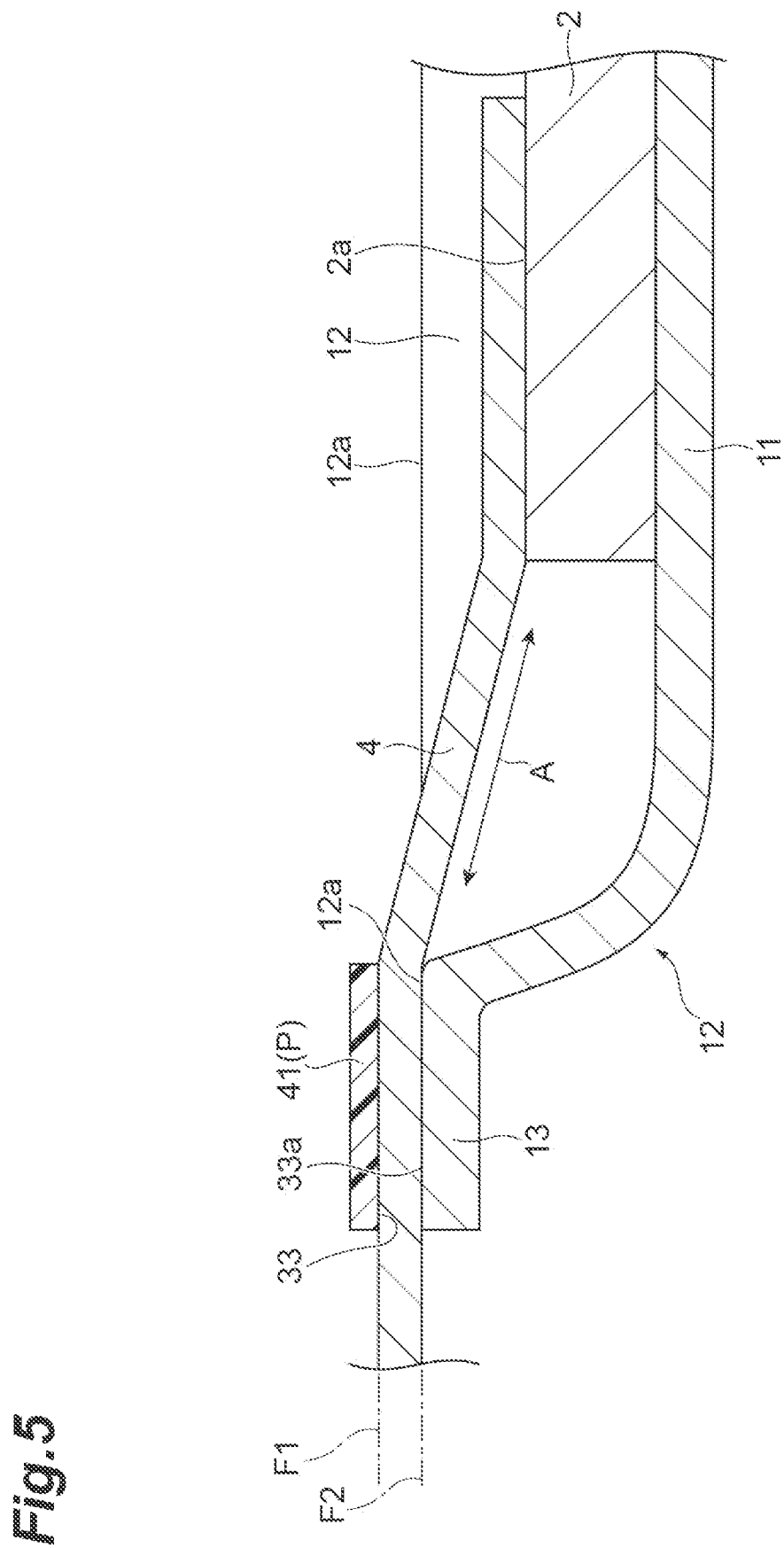
FIG. 5 is a cross-sectional view taken along line V-V in FIG. 1.

FIG. 4 is a cross-sectional view taken along line IV-IV in FIG. 1, and FIG. 5 is a cross-sectional view taken along line V-V in FIG. 1. As illustrated in FIGS. 4 and 5, for holding the wiring member 4, the side surface portions 12 have a first surface F1 formed on the top portions 12a of the side surface portions 12, and a second surface F2 that is one step lowered from the first surface F1 by the cutout portion 33 described above that is formed on the top portion 12a.

In the present embodiment, as illustrated in FIG. 1, the first surface F1 is defined by the top portions 12a of three side surface portions 12 corresponding to the upper base 21 and the pair of oblique sides 23 and 23 of the bottom surface portion 11, and by three flange portions 13 leading to the top portions 12a. The first surface F1 is defined to surround a periphery of the piezoelectric unit 2 in three directions in a plan view of the housing 3, except for a formation position of the cutout portion 33. The second surface F2 is defined by a bottom surface 33a of the cutout portion 33. The second surface F2 is located closer to a bottom surface portion 11 side than the first surface F1 by a distance that is the same as the thickness of the wiring member 4 or that is slightly larger than the thickness thereof. A height of the second surface F2 from the bottom surface portion 11 is higher than a height of one surface 2a of the piezoelectric unit 2 from the bottom surface portion 11.

A joining member P that joins the housing 3 to the external device is disposed on the first surface F1. Here, the joining member P is formed of the double-sided tape 41. The double-sided tape 41 is disposed over a substantially entirety of the first surface F1. As illustrated in FIG. 4, the double-sided tape 41 is disposed to bridge over the cutout portion 33 at a position of the cutout portion 33. Therefore, the double-sided tape 41 is separated from the second surface F2 with a spacing therebetween, the spacing being approximately the same as the depth of the cutout portion 33. As the joining member P, an epoxy-based adhesive agent, a urethane-based adhesive agent, silicon, or the like may be used.

As illustrated in FIG. 4, the wiring member 4 passes through the cutout portion 33 between the first surface F1 and the second surface F2. The wiring member 4 is joined to the double-sided tape 41 at a position of the first surface F1. On the other hand, the wiring member 4 is not joined to the second surface F2. The wiring member 4 may be in contact with the second surface F2, or may be separated from the second surface F2.

The wiring member 4 is connected to the one surface 2a side of the piezoelectric unit 2 using an anisotropic conductive adhesive material or the like. In addition, the wiring member 4 passes through the cutout portion 33, and is joined to the double-sided tape 41 at the position of the first surface F1. The wiring member 4 is disposed to be inclined so as to gradually rise toward the cutout portion 33 between the piezoelectric unit 2 and the cutout portion 33. As illustrated in FIG. 5, the wiring member 4 is linearly inclined at a constant angle from an edge on a cutout portion 33 side of the piezoelectric unit 2 to an edge on a piezoelectric unit 2 side of the cutout portion 33. In this state, a tensile force (arrow A of FIG. 5) is applied to the wiring member 4 in an extending direction of the wiring member 4 between the piezoelectric unit 2 and the cutout portion 33.

As described above, in the vibration device 1, the double-sided tape 41 that joins the housing 3 to the external device is disposed on the first surface F1 of the top portions 12a of the side surface portions 12. In the present embodiment, the side surface portions 12 are disposed to surround the piezoelectric unit 2 in the three directions, and the first surface F1 is formed of the top portions 12a of the side surface portions 12 and the flange portions 13 provided on the top portions 12a. For this reason, the housing 3 can be brought into close contact with the external device via the double-sided tape 41, and a state of attachment of the vibration device 1 to the external device can be stabilized.

In addition, in the vibration device 1, the wiring member 4 passes through the cutout portion 33 provided in the top portion 12a of the side surface portion 12, and is joined to the double-sided tape 41 that bridges over the cutout portion 33, at the position of the first surface F1, but is not joined to the second surface F2 that is one step lowered from the first surface F1. Since the wiring member 4 is joined to the double-sided tape 41 on the first surface F1, the wiring member 4 can be prevented from wobbling around the piezoelectric unit 2, and an influence on space design accuracy can be avoided. Since the wiring member 4 is not joined to the second surface F2, even when a dimensional error occurs in the cutout portion or the like, flatness of the joining member P on the first surface F1 is maintained, and stability of the state of attachment of the vibration device 1 is maintained. Therefore, in the vibration device 1, a space characteristic around the piezoelectric unit 2 can be easily ensured, and an acoustic characteristic is improved.

In the present embodiment, a tensile force is applied to the wiring member 4 in the extending direction of the wiring member 4 between the piezoelectric unit 2 and the cutout portion 33. Accordingly, even when vibration is applied to the housing 3, the generation of collision sound by interference of the wiring member 4 with the housing 3 can be suppressed. Therefore, an influence of the vibration on the space characteristic can be avoided.

In the present embodiment, the side surface portions 12 are smoothly continuous with the bottom surface portion 11, and are inclined to open outward from the edge portion with respect to the bottom surface portion 11. Accordingly, vibration can be efficiently transmitted to the side surface portions 12 from the bottom surface portion 11 on which the piezoelectric unit 2 is disposed, and vibration of the bottom surface portions 11 and vibration of the side surface portions 12 can be sufficiently extracted as an output. Therefore, the acoustic characteristic is further improved.

The present disclosure is not limited to the above embodiment. For example, in the above embodiment, a mode has been described in which the plan shape of the bottom surface portion 11 of the housing 3 is a trapezoidal shape, but the plan shape of the bottom surface portion 11 is not limited thereto, and may be other shapes such as a rectangular shape, a square shape, a circular shape, and an elliptical shape.

Figure 6:
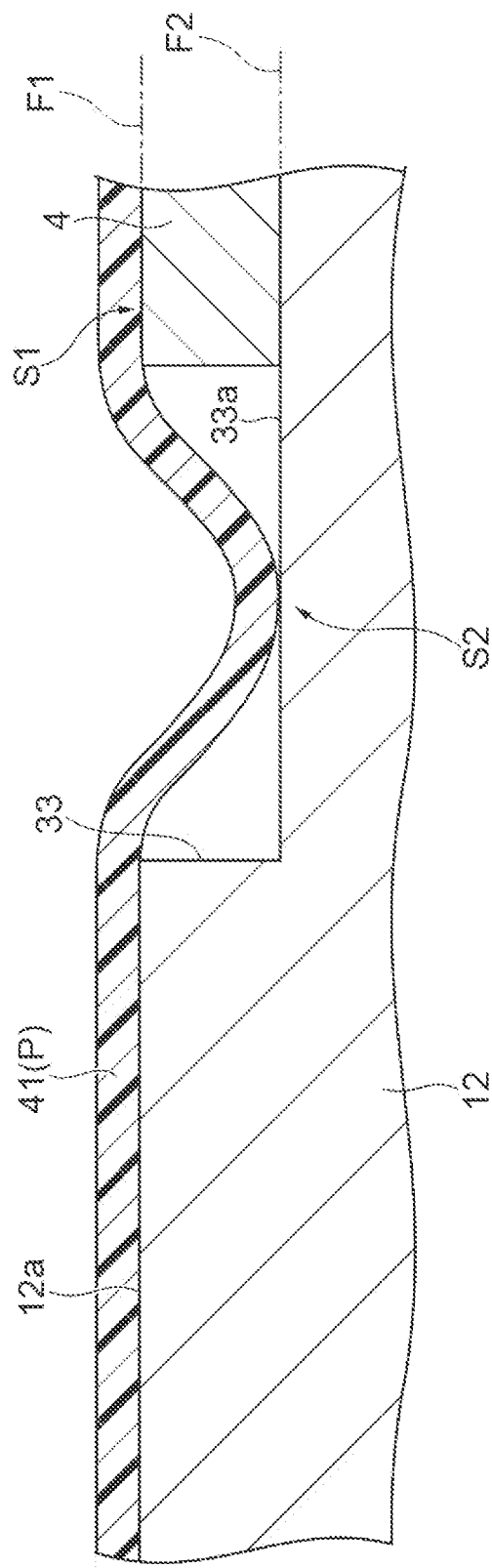
FIG. 6 is a schematic cross-sectional view illustrating another disposition example of a joining member.

In addition, in the above embodiment, the double-sided tape 41 is separated from the second surface F2 with a spacing therebetween, the spacing being approximately the same as the depth of the cutout portion 33, but as illustrated in FIG. 6, the double-sided tape 41 may be joined to at least a part of the second surface F2. In the example of FIG. 6, the double-sided tape 41 is flexed toward the cutout portion 33 side on both sides of the wiring member 4, and is joined to the second surface F2 in the vicinity of a top of a flexed portion. According to such a configuration, since the wiring member 4 is joined to both the first surface F1 and the second surface F2, the wiring member 4 can be more reliably prevented from wobbling around the piezoelectric unit 2.

When the double-sided tape 41 is joined to at least a part of the second surface F2, it is preferable that a joining area S1 between the wiring member 4 and the double-sided tape 41 is larger than a joining area S2 between the second surface F2 and the double-sided tape 41. In this case, excessive joining between the second surface F2 and the double-sided tape 41 can be avoided, and flatness of the double-sided tape 41 on the first surface F1 can be maintained.

What is claimed is:

1. A vibration device comprising:
   a piezoelectric unit including a piezoelectric element;
   a housing that holds the piezoelectric unit;
   a wiring member electrically connected to the piezoelectric unit; and
   a joining member that joins the housing to an external device,
   wherein the housing includes a bottom surface portion to which the piezoelectric unit is fixed, and a side surface portion standing at an edge portion of the bottom surface portion,
   the side surface portion has a first surface formed on a top portion of the side surface portion, and a second surface that is one step lowered from the first surface by a cutout portion formed in the top portion,
   the joining member extends along the first surface to bridge over the cutout portion, and
   the wiring member is joined to the joining member at a position of the first surface, and passes through the cutout portion in a state where the wiring member is not joined to the second surface.

2. The vibration device according to claim 1,
   wherein the joining member is joined to at least a part of the second surface.

3. The vibration device according to claim 2,
   wherein a joining area between the wiring member and the joining member is larger than a joining area between the second surface and the joining member.

4. The vibration device according to claim 1,
   wherein a tensile force is applied to the wiring member in an extending direction of the wiring member between the piezoelectric unit and the cutout portion.

5. The vibration device according to claim 1,
   wherein the side surface portion is smoothly continuous with the bottom surface portion, and is inclined to open outward from the edge portion with respect to the bottom surface portion.

* * * * *